United States Patent [19]

Hashimoto et al.

[11] Patent Number: 4,985,672
[45] Date of Patent: Jan. 15, 1991

[54] TEST EQUIPMENT FOR A LOW CURRENT IC

[75] Inventors: Yoshihiro Hashimoto; Shoji Yamazaki; Shunsuke Katoh, all of Gyoda, Japan

[73] Assignee: Advantest Corporation, Tokyo, Japan

[21] Appl. No.: 448,506

[22] Filed: Dec. 11, 1989

[51] Int. Cl.⁵ .................... G01R 31/28; G01R 31/22
[52] U.S. Cl. ........................... 324/158 R; 324/73.1; 371/25.1
[58] Field of Search ............ 324/158 R, 73.1, 103 R; 371/15.1, 20.1, 25.1; 437/8

[56] References Cited

U.S. PATENT DOCUMENTS

| | | | |
|---|---|---|---|
| 3,988,672 | 10/1976 | Cowart | 324/158 R |
| 4,456,880 | 6/1984 | Warner et al. | 324/158 R |
| 4,459,693 | 7/1984 | Prang et al. | 324/73.1 |
| 4,710,704 | 12/1987 | Ando | 324/103 R |
| 4,771,428 | 9/1988 | Acuff et al. | 324/73.1 |
| 4,820,974 | 4/1989 | Katsura et al. | 324/158 R |

Primary Examiner—Reinhard J. Eisenzopf
Assistant Examiner—Vinh P. Nguyen
Attorney, Agent, or Firm—Staas & Halsey

[57] ABSTRACT

In equipment which measures current of ICs for testing them, there are provided a first current detector for detecting current which flows through an IC under test when applying voltage from a voltage source to a power source terminal of the IC to which a smoothing capacitor is connected, a buffer amplifier for extracting the voltage to be applied to the power source terminal, a compensating capacitor which is supplied with the output of the buffer amplifier and provides a charging-/discharging current equivalent to that which flows through the smoothing capacitor, a second current detector for detecting the charging/discharging current of the compensating capacitor, and a subtractor for subtracting the output of the second current detector from the output of the first current detector. By subtracting the charging/discharging current of the compensating capacitor from the current flowing from the voltage source to the IC under test, the current flowing to the IC under test can be measured without being affected by the charging/discharging current of the smoothing capacitor.

15 Claims, 3 Drawing Sheets

TEST EQUIPMENT FOR A LOW CURRENT IC

BACKGROUND OF THE INVENTION

The present invention relates to IC test equipment for testing an IC whose steady-state current is far smaller than its operating current, such as a CMOS.

FIG. 1 shows the circuit arrangement of conventional IC test equipment. This test equipment is to test the DC characteristics of an IC under test 100 and has an arrangement in which a known voltage $V_S$ is applied from a voltage source 200 to a power source terminal of the IC under test 100 and a current $I_R$ corresponding to a current $I_L$ flowing through the IC 100 is detected by a current detector 300.

The current detector 300 comprises a current detecting resistor $R_M$ connected in series between the voltage source 200 and the IC under test 100 and a differential amplifier 301 for extracting voltage which is developed across the resistor $R_M$ in proportion to the current $I_R$. The output voltage of the differential amplifier 301 is converted by an A-D converter 302 into a digital value. A feedback circuit 400 includes an operational amplifier 402 forming a voltage-follower amplifier. By the feedback circuit 400 the same voltage as that $V_S$ to be applied to the IC under test 100 is fed back to an operational amplifier 201 of the voltage source 200, causing it to operate so that a voltage Vi from a reference voltage source 202 is applied accurately as the voltage $V_S$ to the IC under test 100. Reference numeral 500 indicates a guard amplifier.

The guard amplifier 500 is also a voltage-follower amplifier, which is supplied with the applied voltage $V_S$ of the IC under test 100 detected by the feedback circuit 400 and outputs the same voltage as the input one. The guard amplifier 500 is provided for driving by its output the feedback circuit 400 so that the potential of an outer conductor 501 of a cable 502 used as an input line 401 of the feedback circuit 400 becomes equal to the potential $V_S$ of the input line 401, thereby excluding the influence of the stray capacitance and insulating resistance of the cable 502 to ensure the feedback of the correct voltage $V_S$ to the voltage source 200.

A smoothing capacitor 600 is connected in parallel to the IC under test 100, for smoothing fluctuations in the applied voltage $V_S$ which are caused by the operation of the IC under test 100. When the IC under test 100 is a CMOS type IC, only a very slight current flows therethrough during its quiescent period, whereas when it is driven, a current flowing therethrough is about several thousands times larger. For example, a CMOS memory which is written and read out at a clock period consumes current pulsewise accordingly.

In measurements of the DC characteristic (i.e. an applied voltage vs. power consumption variation characteristic) of such an IC during its operation, when the IC under test 100 dissipates current pulsewise as mentioned above, charges stored in the smoothing capacitor 600, which is connected to a so-called test head to which the IC 100 is also connected, are released to prevent a transient voltage drop, smoothing the voltage to be applied to the IC under test 100. The kind and static capacitance of the smoothing capacitor 600 are selected properly in accordance with the operating or performance characteristic of the IC under test 100.

Incidentally, the smoothing capacitor 600 is effective for a so-called function test of measuring current flowing through the IC under test 100 being operated while applying voltage thereto, but the smoothing capacitor 600 constitutes an obstacle to a so-called static test of measuring current flowing through the IC under test 100 being held quiescent while applying voltage thereto and determining whether or not the current is within a given limit range.

That is, the IC under test 100 is subjected to the static test in which a predetermined power source voltage is applied to the power source terminal of the IC 100 without operating it and it is determined whether or not current flowing therethrough at that time is within a predetermined limit range. In this static test, when the voltage Vi is applied to the IC 100 from the voltage source 200 as shown in FIG. 2A, the current $I_R$ flowing through the current detector 300 is the sum of the current $I_L$ flowing to the IC under test 100 and a charging current $I_{CL}$ flowing to the smoothing capacitor 600 as shown in FIG. 2B. Since the static test is intended to measure the current $I_L$ which flows through the IC under test 100, a decision unit (not shown) reads out the value of the current $I_L$ from the A-D converter 302 after the charging current $I_{CL}$ to the smoothing capacitor 600 returns to zero.

The smoothing capacitor 600 can be generally expressed by an equivalent circuit depicted in FIG. 3, and the total current I which flows through the capacitor 600 when a DC voltage is applied thereto is given by the following expression:

$$I = I_c + I_d + I_r = \frac{V}{R} \exp\left(-\frac{t}{CR}\right) + \frac{dQ_p}{dt} + \frac{V}{r}$$

where V is the applied voltage, R an equivalent series resistance (an internal resistance of the power source 20), C the electrostatic capacitance of the capacitor, $Q_p$ polarization charges of the capacitor, and r the insulation resistance of the capacitor. The current I decreases with time t and, after a sufficient elapsed time, reaches a constant value.

The first term $I_c$ of the above expression is the charging current of the capacitor of the electrostatic capacitance C. The second term $I_d$ is called a dielectric current, which depends on the kind of the dielectric of the capacitor and the electric field intensity applied thereto. The third term $I_r$ is a leakage current of the capacitor by its insulation resistance r. Usually, the relaxation time of the capacitor is so long that it is difficult to accurately measure the third term $I_r$ based on the insulation resistance r. In general, the ratio between the total current value I one to two minutes after the voltage application and the applied voltage V is defined as the insulation resistance from the practical point of view.

Since much time is taken until the charging/discharging current of the capacitor becomes stable as mentioned above, waiting time inevitably increases for an accurate measurement of the current $I_L$ flowing through the IC under test 100. This constitutes an obstacle to testing of many ICs.

SUMMARY OF THE INVENTION

It is therefore an object of the present invention to provide an IC test equipment which permits measurement of current flowing through an IC under test without the need of waiting until the charging/discharging current of the smoothing capacitor becomes stable.

The IC test equipment for testing the voltage-current characteristic of an IC according to the present invention includes: a first current detector for detecting current flowing through the IC under test; a buffer amplifier for extracting voltage being applied to the power source terminal of the IC under test without exerting any influence on the voltage; a compensating capacitor supplied with the output voltage of the buffer amplifier, for generating a charging/discharging current equivalent to that flowing through the smoothing capacitor; a second current detector for detecting the charging/discharging current produced by the compensating capacitor; and a subtractor for subtracting the detected current by the second current detector from the detected current by the first current detector to obtain the value of current flowing through the IC under test.

According to the present invention, the compensating capacitor is provided for producing a charging/discharging current equivalent to that flowing through the smoothing capacitor, the charging/discharging current generated by the compensating capacitor is detected by the second current detector and the detected current is subtracted from the detected current by the first current detector, whereby the value of the charging/discharging current of the smoothing capacitor can be removed from the value of current detected by the first current detector. Consequently, the value of current flowing through the IC under test can be accurately be obtained even when the charging/discharging current of the smoothing capacitor is flowing.

DESCRIPTION OF THE PREFERRED EMBODIMENTS

Figure 1:
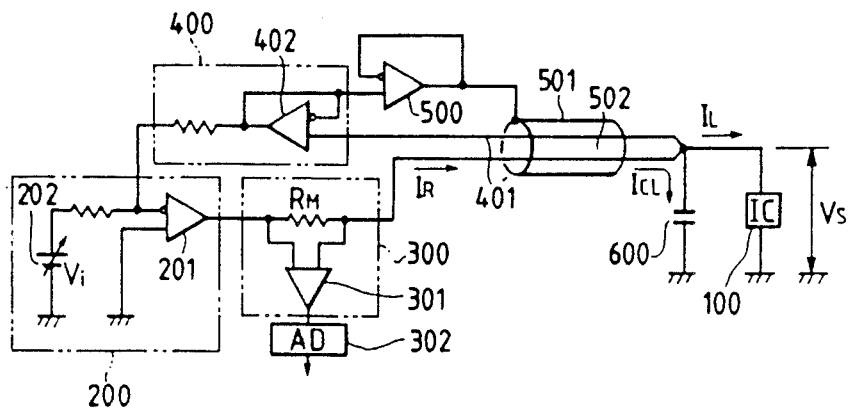
FIG. 1 is a circuit diagram for explaining a conventional IC test equipment.
Figure 4:
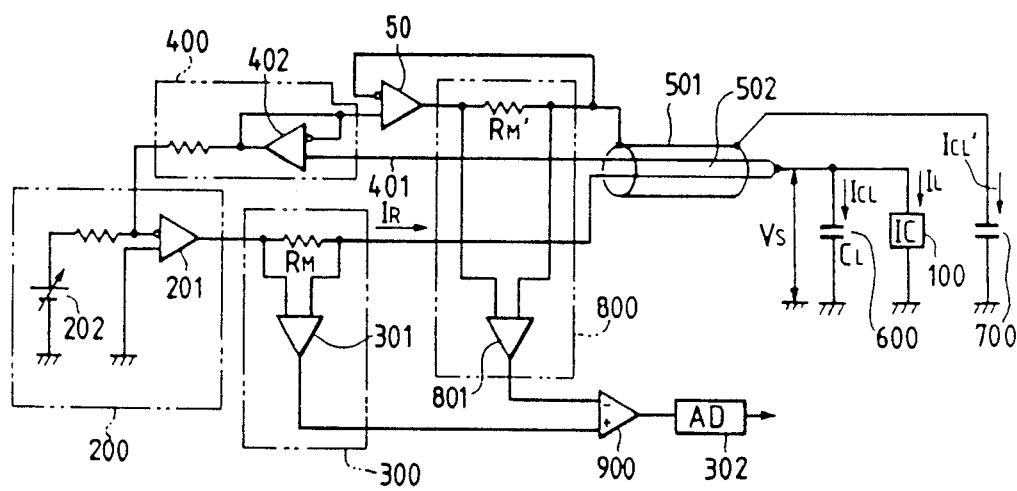
FIG. 4 is a circuit diagram for explaining an embodiment of the present invention.
Figure 2:
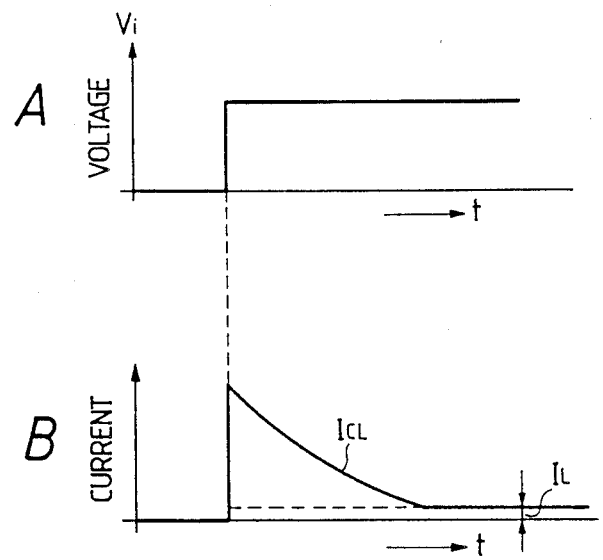
FIGS. 2A and 2B are graphs for explaining the current measuring operation of the conventional IC test equipment.
Figure 3:
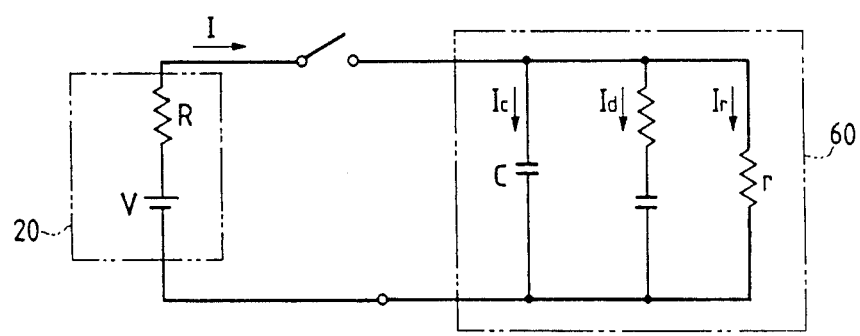
FIG. 3 is a diagram showing an equivalent circuit of a smoothing capacitor.

FIG. 4 illustrates an embodiment of the present invention, in which the parts corresponding to those in FIG. 1 are identified by the same reference numerals. This embodiment is identical with the prior art except of FIG. 1 in that a desired voltage is applied from the voltage source 200 to the IC under test 100 via the first current detector 300, that the smoothing capacitor 600 is connected in parallel to the IC under test 100, that the voltage $V_S$ to be applied to the IC under test 100 is fed via the feedback circuit 400 back to the voltage source 200 to control it so that the voltage $V_S$ becomes equal to the input voltage Vi, and the voltage $V_S$ extracted by the feedback circuit 400 is applied to the guard amplifier 500 to hold equipotential the outer conductor 501 of the coaxial cable 502 forming the input line 401 of the feedback circuit 400 and the input line 401, thereby eliminating the influence of the stray capacitance and the insulation resistance of the coaxial cable 502.

This embodiment further includes a buffer amplifier 50 for extracting the voltage $V_S$ to be applied to the IC under test 100 without exerting any influence on the voltage $V_S$, a compensating capacitor 700 which is supplied with the extracted voltage and generates a charging/discharging current $I'_{CL}$ equivalent to that $I_{CL}$ of the smoothing capacitor 600, and a second current detector 800 for detecting the charging/discharging current $I'_{CL}$ produced by the compensating capacitor 700. In this embodiment the guard amplifier 500 is used also as the buffer amplifier 50.

As described previously with respect to FIG. 1, the output voltage of the guard amplifier 500 is always held equal to the voltage $V_S$ being applied to the IC under test 100, and the compensating capacitor 700 of the same kind and the same electrostatic capacitance as those of the smoothing capacitor 600 is connected to the outer conductor 501 of the coaxial cable 502 connected to the output side of the guard amplifier 500. The second current amplifier 800 is made up of a current detecting resistor $R'_M$ connected in series to the output side of the buffer amplifier, i.e. the guard amplifier 500 and a differential amplifier 801 which extracts voltage developed across the resistor $R'_M$, as is the case with the first current detector 300.

The detected output signals of the first and second current detectors 300 and 800 are provided to a differential amplifier which forms a subtractor 900, wherein the current $I'_{CL}$ flowing through the compensating capacitor 700 is subtracted from the sum current, $I_L + I_{CL}$, of the current $I_L$ flowing through the IC under test 100 and the charging/discharging current $I_{CL}$ of the smoothing capacitor 600.

By using, as the compensating capacitor 700, a capacitor of the same capacitance and the same material as those of the smoothing capacitor 600, the charging/discharging current generated by the compensating capacitor 700 can be made equal to the charging/discharging current of the smoothing capacitor 600, i.e. $I_{CL} = I'_{CL}$. As a result of this, the output signal of the subtractor 900 becomes equivalent to the current $I_L$ flowing through the IC under test 100.

The output of the subtractor 900 is converted by the A-D converter 302 to a digital value for input into a decision unit formed by, for example, a computer (not shown), wherein it is compared with a reference value to determine whether the IC under test 100 is good or bad.

Figure 5:
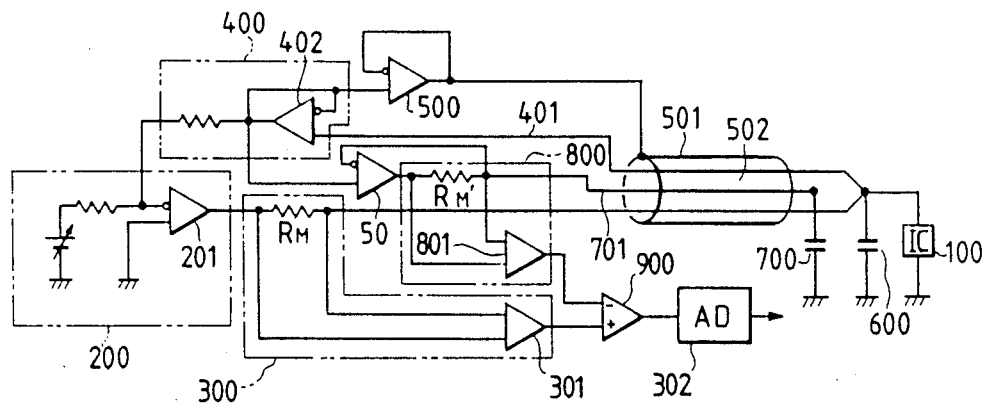
FIG. 5 is a circuit diagram illustrating another embodiment of the present invention.

FIG. 5 illustrates another embodiment of the present invention, in which the buffer amplifier 50 is provided separately of the guard amplifier 500 and has its input terminal connected to the output of the voltage follower amplifier of the feedback circuit 400. Further, the output of the buffer amplifier 50 is connected via the current detecting resistor $R'_M$ to a signal line 701 of the cable 502 and the compensating capacitor 700 is connected to the signal line 701 at the same side as the smoothing capacitor 600. This embodiment is identical in construction with the FIG. 4 embodiment except the above.

Figure 6:
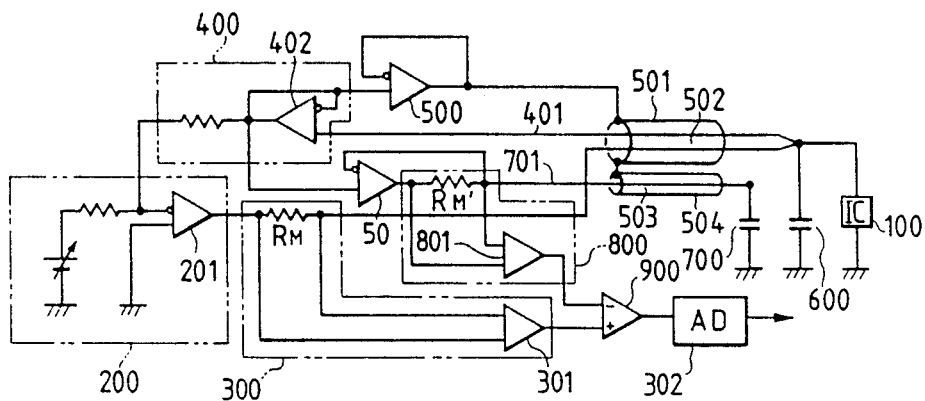
FIG. 6 is a circuit diagram illustrating still another embodiment of the present invention.

FIG. 6 illustrates a modified form of the FIG. 5 embodiment, in which the output of the buffer amplifier 50 is connected via the current detecting resistor $R'_M$ to a signal line 701 of another cable 503 different from the cable 502 and the compensating capacitor 700 is connected to the other end of the signal line 701. An outer conductor 504 of the cable 503 is connected to the outer conductor 501 of the cable 502. This embodiment is identical in construction with the FIG. 5 embodiment except the above.

While in FIGS. 5 and 6 the input of the buffer amplifier 50 is shown to be connected to the output side of the operational amplifier 402, it is evident that the input of the buffer amplifier 50 may also be connected to the input side of the operational amplifier 402, that is, the input line 401.

As described above, according to the present invention, a current equivalent to the charging/discharging current of the smoothing capacitor 600 is produced by the compensating capacitor 700 and the value of this charging/discharging current is subtracted from the detected current of the first current detector, by which the charging/discharging current value of the smoothing capacitor 600 can be removed.

Thus, the current $I_L$ flowing through the IC under test 100 can be accurately detected even while a charging/discharging current is flowing through the smoothing capacitor 600. This permits measurement of the current $I_L$ flowing through the IC under test 100 immediately after the application of the power source voltage to the IC under test 100, and hence affords reduction of the time for test.

Although in the above the capacitance of the compensating capacitor 700 is described to be selected equal to the capacitance of the smoothing capacitor 600, these capacitors need not always be the same if a gain control circuit is provided on the output side of the second current detector 800.

It will be apparent that many modifications and variations may be effected without departing from the scope of the novel concepts of the present invention.

What is claimed is:

1. An IC test equipment comprising:
   a voltage source for applying a predetermined power source voltage to an IC under test;
   first current detecting means for detecting current flowing from said voltage source to said IC under test;
   a smoothing capacitor for smoothing pulsations of said voltage applied to said IC under test which are caused by its operation;
   compensating means for generating a current equivalent to a charging/discharging current which flows through said smoothing capacitor when voltage is applied to a power source terminal of said IC under test;
   second current detecting means for detecting said current generated by said compensating means; and
   calculating means for subtracting the detected outputs of said first and second current detecting means one from the other to obtain the value of current flowing through said IC under test.

2. The IC test equipment of claim 1 wherein said compensating means includes a buffer amplifier, having an output for extracting said voltage to be applied to said power source terminal of said IC under test, without exerting any influence on said voltage, and a compensating capacitor which is supplied with the output voltage of said buffer amplifier and charges and discharges said current equivalent to said charging/discharging current flowing through said smoothing capacitor.

3. The IC test equipment of claim 2 wherein said second current detecting means includes a current detecting resistor connected in series to the output side of said buffer amplifier and a differential amplifier extracting voltage across said current detecting resistor.

4. The IC test equipment of claim 2, wherein said compensating capacitor is of the same kind and the same electrostatic capacitance as those of said smoothing capacitor.

5. The IC test equipment of claim 1 wherein said IC under test has a power source terminal, and said test equipment further comprises a voltage follower amplifier which is connected via a signal line of a coaxial cable to said power source terminal of said IC under test and forms a feedback path through which said voltage to be applied to said power source terminal is fed back to said voltage source, and guard amplifier which has its input terminal connected to said feedback path and its output connected to an outer conductor of said coaxial cable and operates said outer conductor and said signal line equipotential to each other.

6. The IC test equipment of claim 5 wherein said compensating means includes a compensating capacitor connected to said guard amplifier and said outer conductor of said coaxial cable.

7. The IC test equipment of claim 6 wherein said second current detecting means includes a current detecting resistor connected in series to the output side of said guard amplifier and a differential amplifier for extracting voltage across said current detecting resistor.

8. The IC test equipment of claim 6 wherein said compensating capacitor is of the same kind and the same electrostatic capacitance as those of said smoothing capacitor.

9. The IC test equipment of claim 5 wherein said compensating means includes a buffer amplifier, having an output, which has its input terminal connected to said feedback path and extracts said voltage to be applied to said power source terminal, without exerting any influence on said voltage, and a compensating capacitor which is supplied with the output voltage of said buffer amplifier and charges and discharges said current equivalent to said charging/discharging current flowing through said smoothing capacitor.

10. The IC test equipment of claim 9 wherein the output of said buffer amplifier and said compensating capacitor are connected via another signal line of said coaxial cable.

11. The IC test equipment of claim 10 wherein said compensating capacitor is of the same kind and the same electrostatic capacitance as those of said smoothing capacitor.

12. The IC test equipment of claim 9 wherein the output side of said buffer amplifier and said compensating capacitor are connected via a signal line of another coaxial cable and said outer conductor of said coaxial cable is connected to an outer conductor of said another coaxial cable.

13. The IC test equipment of claim 12 wherein said compensating capacitor is of the same kind and the same electrostatic capacitance as those of said smoothing capacitor.

14. The IC test equipment of claim 9 wherein said second current detecting means includes a current detecting resistor connected in series to the output of said buffer amplifier and a differential amplifier extracting voltage across said current detecting resistor.

15. The IC test equipment of claim 9 wherein said compensating capacitor is of the same kind and the same electrostatic capacitance as those of said smoothing capacitor.

* * * * *